(12) United States Patent
Arakawa et al.

(10) Patent No.: US 6,603,138 B2
(45) Date of Patent: Aug. 5, 2003

(54) QUANTUM-CONFINEMENT STARK EFFECT OPTICAL MODULATOR

(75) Inventors: Satoshi Arakawa, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/791,439

(22) Filed: Feb. 21, 2001

(65) Prior Publication Data
US 2001/0034071 A1 Oct. 25, 2001

(30) Foreign Application Priority Data
Feb. 22, 2000 (JP) ........................................ 2000-044252

(51) Int. Cl.$^7$ .............................................. H01L 29/06
(52) U.S. Cl. ................................ 257/14; 257/12; 257/9; 257/94
(58) Field of Search ............................ 438/22; 257/94, 257/14, 12

(56) References Cited

U.S. PATENT DOCUMENTS

| | | | | |
|---|---|---|---|---|
| 5,131,060 A | * | 7/1992 | Sakata | 385/2 |
| 5,229,622 A | * | 7/1993 | Cavailles | 257/21 |
| 5,764,670 A | * | 6/1998 | Ouchi | 372/45 |
| 5,808,314 A | * | 9/1998 | Nakajima et al. | 257/17 |
| 5,912,475 A | * | 6/1999 | Itagaki et al. | 257/94 |
| 5,953,479 A | * | 9/1999 | Zhou et al. | 385/131 |
| 6,100,543 A | * | 8/2000 | Sakata | 257/21 |

* cited by examiner

*Primary Examiner*—David Nelms
*Assistant Examiner*—Thao Le
(74) *Attorney, Agent, or Firm*—Sheppard Mullin Richter & Hampton LLP

(57) ABSTRACT

A quantum confinement Stark effect (QCSE) optical modulator has a ridge stripe including a current confinement structure. The current confinement structure includes an AlInAs layer which is subjected to selective oxidation of Al content in the AlInAs layer. The current confinement structure is such that a pair of Al-oxidized regions of the AlInAs layer sandwiches therebetween a central un-oxidized region.

9 Claims, 15 Drawing Sheets

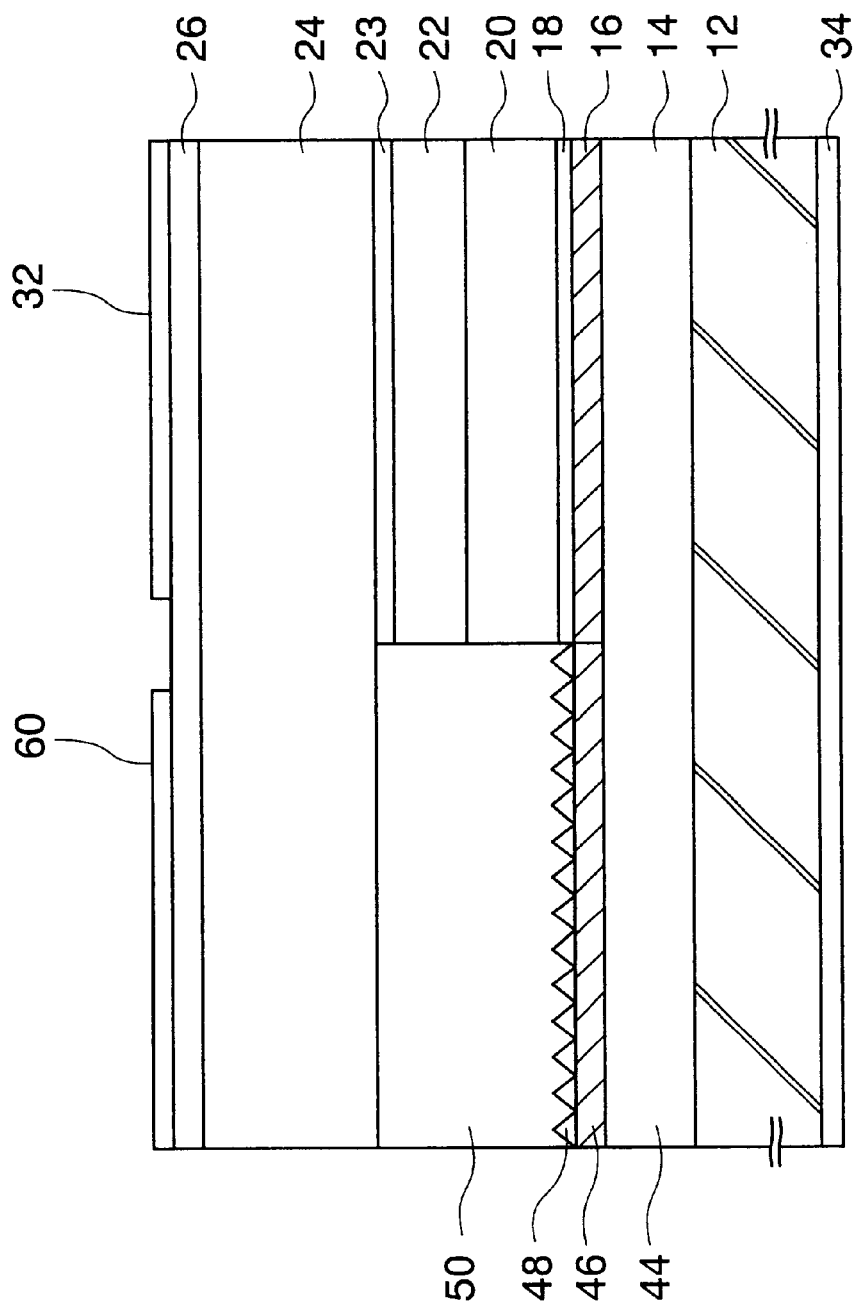

QUANTUM-CONFINEMENT STARK EFFECT OPTICAL MODULATOR

BACKGROUND OF THE INVENTION (a) Field of the Invention

The present invention relates to a quantum-confinement Stark effect (QCSE) optical modulator, and an integrated semiconductor optical device including a semiconductor laser device and a QCSE optical modulator integrated on a single chip.

More specifically, the present invention relates to such a QCSE optical modulator or a semiconductor optical device having a lower device resistance and an excellent frequency characteristic.

The present invention also relates to a method for fabricating the QCSE optical modulator and an integrated semiconductor optical device including the QCSE optical modulator and a semiconductor laser device.

(b) Description of the Related Art

In a super-lattice structure, if an electric field is applied normal to the layers, excitons are hardly dissociated in a moderate electric field due to the presence of a barrier layer preventing the dissociation of the excitons. For example, if an electric field of $10^4$ volts/cm is applied to a quantum well having a width of 10 nm, the quantum well is inclined by an amount corresponding to 10 meV. This range of the electric field scarcely causes the excitons in the quantum well to dissociate, and only a peak of the optical absorption spectrum is observed to shift toward a lower energy level. This phenomenon is called QCSE.

A QCSE optical modulator including an AlGaInAs-based quantum well structure and taking advantage of the QCSE is described in "Journal of Lightwave Technology", vol. 8, No. 7, July 1990, and recited to have a lower operational voltage and achieve a higher-speed modulation compared to GaInAsP-based QCSE optical modulator.

FIG. 1 shows a conventional QCSE optical modulator (may be referred to as simply "optical modulator" hereinafter). The optical modulator is of a waveguide type and includes a p-i-n structure formed on an InP substrate 112, the p-i-n structure being such that AlGaInAs/AlInAs multiple quantum well (MQW) 118 constituting an intrinsic layer is sandwiched between a p-type cladding layer 120 and an n-type cladding layer 116.

The optical modulator 110 has the n-InP substrate 112 and a layer structure including an n-type InP (n-InP) layer 114, the n-AlInAs cladding layer 116, the MQW 118, the p-AlInAs cladding layer 120, and a p-InGaAs contact layer 122, which are consecutively grown on the n-InP substrate 112 by a molecular beam epitaxy (MBE). A p-side electrode 124 and an n-side electrode 126 are formed on the p-type contact layer 122 and the bottom surface of the InP substrate 112, respectively.

The MQW 118 includes a plurality (30) of film pairs each including a 86-angstrom-thick AlGaInAs quantum well layer and a 50-angstrom-thick AlInAs barrier layer and formed in a cyclic order. The n-AlInAs cladding layer 116, MQW 118, p-AlInAs cladding layer 120 and p-InGaAs contact layer are configured as a ridge stripe of a higher mesa structure having a width of 4 µm and a length of 90 to 120 µm.

The p-InP layer 114 and the ridge stripe are covered by a SiO$_2$ film except for the p-side electrode 124.

When a reverse bias voltage is applied to the conventional optical modulator 110 of FIG. 1, the QCSE shifts the peak of the optical absorption spectrum of excitons toward the longer wavelength side, thereby increasing the optical absorption effect of the optical modulator for the laser. This operation uses a reverse bias voltage of the p-i-n junction as a drive current for the change of the optical absorption, and thus achieves a larger change of the optical absorption at a high speed by using a small voltage.

In the conventional optical modulator 110 as described above, there is a problem in that the higher mesa structure of the ridge stripe generally has a rough surface formed on the ridge wall during the etching for configuring the mesa structure, the rough surface causing scattering loss of transmitted light to degrade the device characteristics.

In addition, the small ridge width of the mesa structure raises the resistance of the p-type cladding layer, which has in general a larger resistance compared to the n-cladding layer, and raises the overall device resistance.

Further, it is difficult to adopt a selective growth technique in the case of integration of the conventional optical. modulator with a semiconductor laser device, due to the presence of the Al content in the material for the MQW and the cladding layer.

For the reasons as recited above, a semiconductor optical device having an optical modulator and a semiconductor laser device integrated in a single chip generally has a higher device resistance and lower device characteristics.

SUMMARY OF THE INVENTION

In view of the above problems in the conventional techniques, it is an object of the present invention to provide an optical modulator having a lower electric resistance and excellent device characteristics, to provide a semiconductor optical device including the optical modulator and a semiconductor laser device integrated in a single chip.

It is also an object of the present invention to provide such an optical modulator and a semiconductor optical device.

The present invention provides a quantum confinement Stark effect (QCSE) optical modulator including a compound semiconductor substrate, and a layer structure formed thereon, the layer structure including an AlGaInAs-based multiple quantum well (MQW), a pair of cladding layers having opposite conductivity types and sandwiching therebetween the MQW, and an Al-containing layer overlying the MQW or formed within one of the cladding layers having a p-type conductivity, the layer structure being configured as a ridge stripe at a portion including the Al-containing layer, the Al-containing layer having a current confinement structure wherein a pair of Al-oxidized regions of the Al-containing layer sandwiches therebetween a central un-oxidized region of the Al-containing layer.

In accordance with the optical modulator of the present invention, the width of the cladding layers in the ridge stripe is wider and thus the device electric resistance is lower compared to the conventional optical device, due to the presence of the current confinement structure having a pair of Al-oxidized regions sandwiching therebetween un-oxidized region. In addition, the presence of the current confinement structure having the pair of Al-oxidized regions prevents a rough surface of the ridge side, and thus reduces the transmission loss of the laser. These advantages also result in improvement of the frequency response of the optical modulator.

The Al-containing layer may be an AlInAs layer.

The present invention also provides method for fabricating a quantum confinement Stark effect (QCSE) optical modulator including the steps of:

forming a layer structure on an InP substrate, the layer structure including a multiple quantum well (MQW), pair of cladding layers sandwiching therebetween the MQW and an Al-containing layer overlying the MQW; configuring at least a portion of the layer structure including the Al-containing layer to form a ridge stripe; and selectively oxidizing Al in the Al-containing layer to form a current confinement structure in the ridge structure, the current confinement structure having a pair of Al-oxidized regions of the Al-containing layer sandwiching therebetween an un-oxidized region of the Al-containing layer.

In accordance with the method of the present invention, the structure of the QCSE optical modulator optical device having a lower electric resistance and improved frequency characteristics can be formed with a simple process.

The above and other objects, features and advantages of the present invention will be more apparent from the following description, referring to the accompanying drawings.

BRIEF DESCRIPTION OF THE DRAWINGS

FIG. 6 is a partial sectional view of the optical device of FIG. 4.

PREFERRED EMBODIMENTS OF THE INVENTION

Now, the present invention is more specifically described with reference to accompanying drawings.

First Embodiment

Figure 1:
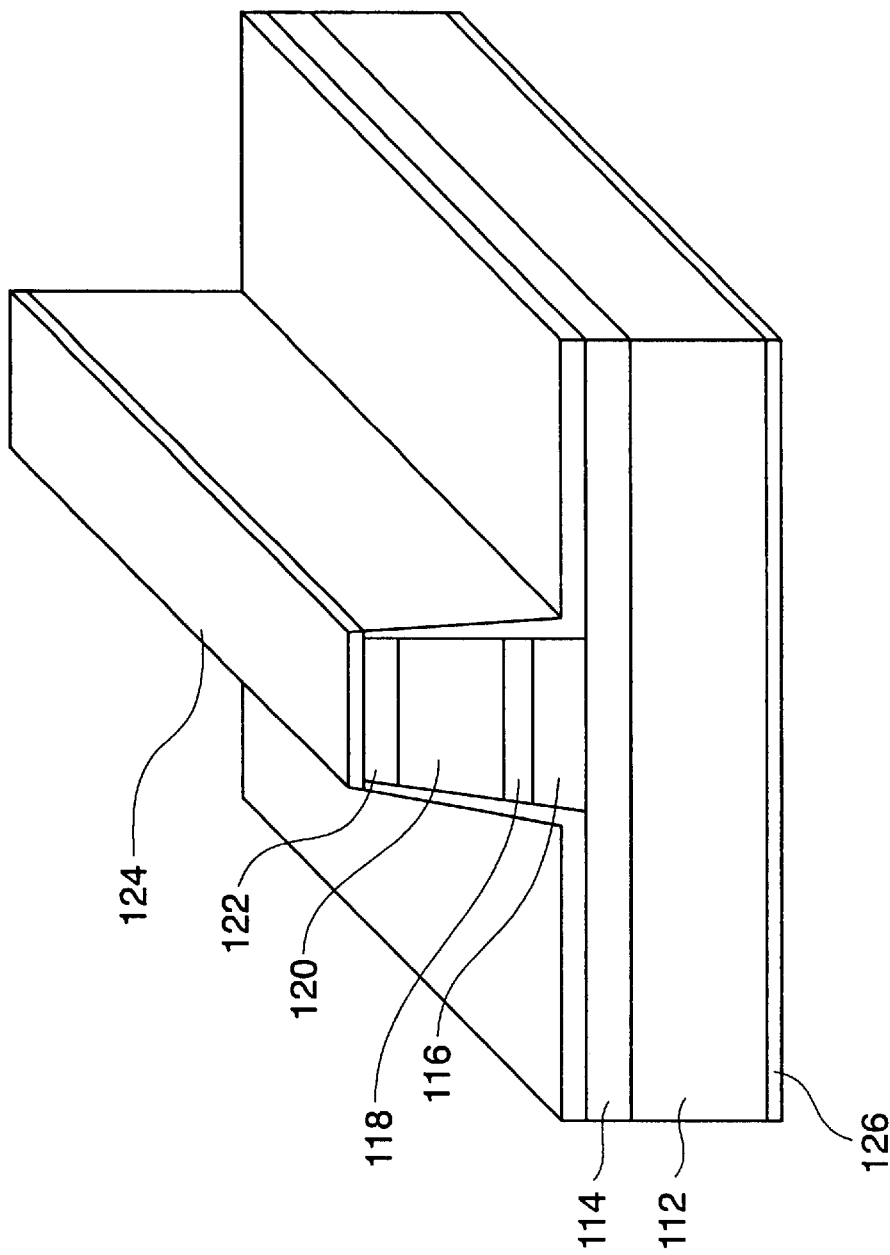
FIG. 1 is a perspective view of a conventional optical modulator.
Figure 2:
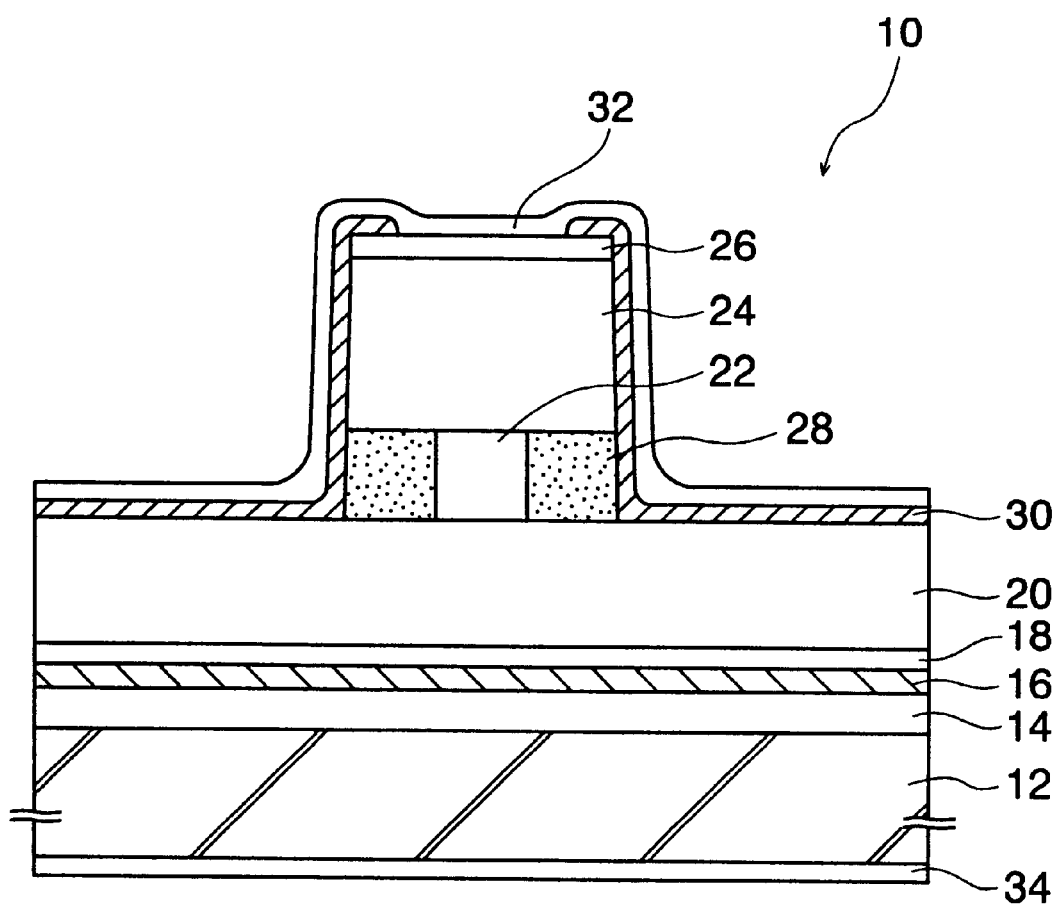
FIG. 2 is a sectional view of an optical modulator according to a first embodiment of the present invention.

Referring to FIG. 2, an optical modulator, generally designated by numeral 10, is an example of the first aspect of the present invention. The optical modulator 10 includes an n-InP substrate 12, and an AlGaInAs-based layer structure including an n-InP cladding layer 14, an AlGaInAs-based MQW 16, a GaInAsP optical confinement layer a p-InP cladding layer 20, a p-AlInAs layer 22, a p-InP cladding layer 24 and a p-GaInAs contact layer 26, which are consecutively grown on the n-InP substrate 12.

The n-InP cladding layer 14 is 100 nm thick, and has a carrier density of $5 \times 10^{17}$ cm$^{-3}$: the MQW has a lasing wavelength ($\lambda$ g) of 1.52 $\mu$m: the GaInAsP optical confinement layer 18 is 10 nm thick and has a wavelength of 1.2 $\mu$m: the p-InP cladding layer 20 is 150 nm thick and has a carrier density of $5 \times 10^{17}$ cm$^{-3}$: the p-AlInAs layer 22 is 100 nm thick and has a carrier density of $1 \times 10^{18}$ cm$^{-3}$: the p-InP cladding layer 24 is 2000 nm thick and has a carrier density of $1 \times 10^{18}$ cm$^{-3}$: and the p-GaInAs contact layer 26 is 300 nm thick and has a carrier density of $1 \times 10^{19}$ cm$^{-3}$.

The MQW structure includes a plurality (10) of film pairs each including a 9-nm-thick GaInAs well layer and a 5-nm-thick AlInAs barrier layer.

Among the layers in the layer structure, the p-AlInAs layer 22, p-InP cladding layer 24 and p-GaInAs contact layer 26 are configured to form a 10-$\mu$m-wide ridge stripe. On each side of the p-AlInAs layer 22, a 3.5-$\mu$m-wide Al-oxidized region 28 formed by selective oxidation of Al content in the p-AlInAs layer 22 extends along the ridge stripe between each of the edges of the un-oxidized region of the AlInAs layer 22 and each side surface of the ridge stripe. The Al-oxidized region 28 forms a current confinement structure in the optical modulator.

On the layer structure including the ridge stripe, a SiN film 30 is formed as an insulator/overcoat film. The SiN film 30 has on top of the ridge stripe an opening, through which a p-side electrode 32 including Ti/Pt/Au metallic films contacts with the underlying p-GaInAs contact layer 26. An n-side electrode 34 including AuGeNi/Au metallic films is formed on the bottom surface of the n-InP substrate 12.

The conventional optical modulator had a 3-$\mu$m-wide ridge stripe, which limited the conductive area for the p-cladding layer having a larger inherent resistance, whereby the device resistance was as high as 8$\Omega$, for example.

On the other hand, a sample of the optical modulator of the present embodiment had a device resistance of 6.8$\Omega$. The lower device resistance is due to the presence of the current confinement structure formed by the Al-oxidized regions 28, which allows the ridge stripe to have a larger width as large as 10 $\mu$m.

The conventional optical modulator without such a current confinement structure exhibited a characteristic frequency of 20 GHz, whereas the sample of the optical modulator of the present embodiment having the current confinement structure had a characteristic frequency of 25 GHz, thereby showing a significant improvement in the frequency characteristics.

Fabrication of the Optical Modulator

Figure 3A:
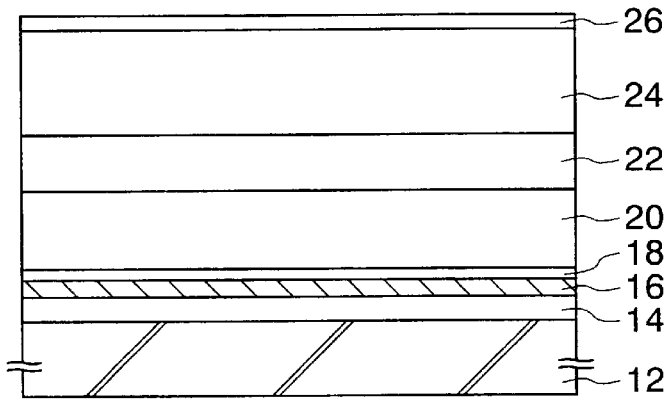
FIGS. 3A to 3C are sectional views of the optical modulator of FIG. 2 for showing consecutive steps of fabrication thereof.

Fabrication of the optical modulator of the embodiment will be described below with reference to FIGS. 3A to 3C. In FIG. 3A, on an n-InP substrate 12, a 100-nm-thick n-InP cladding layer 14 having a carrier density of $5 \times 10^{17}$ cm$^{-3}$, an AlGaInAs-based MQW 16 having a lasikng wavelength of 1.52 $\mu$m, a 10-nm-thick GaInAsP optical confinement layer 18 having a wavelength of 1.2 $\mu$m, a 150-nm-thick p-InP cladding layer 20 having a carrier density of $5 \times 10^{17}$ cm$^{-3}$, and a 100-nm-thick p-AlInAs layer 22 are consecutively grown by epitaxial processes.

Subsequently, a 2000-nm-thick p-InP cladding layer 24 having a carrier density of $1 \times 10^{18}$ cm$^{-3}$, and a 300-nm-thick p-GaInAs contact layer 26 having a carrier density of $1 \times 10^{19}$ cm$^{-3}$ are grown thereon by epitaxial processes.

Figure 3B:
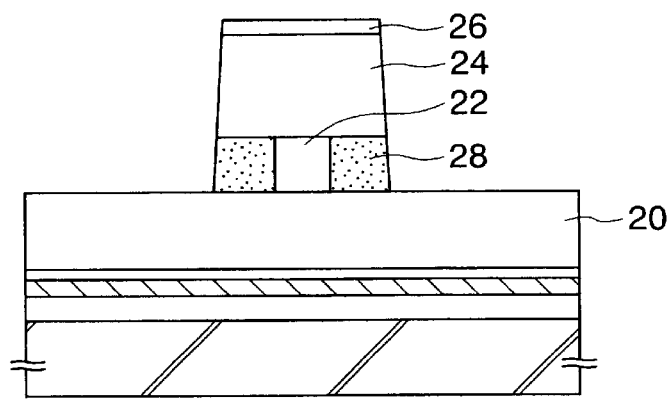
Figure 3C:
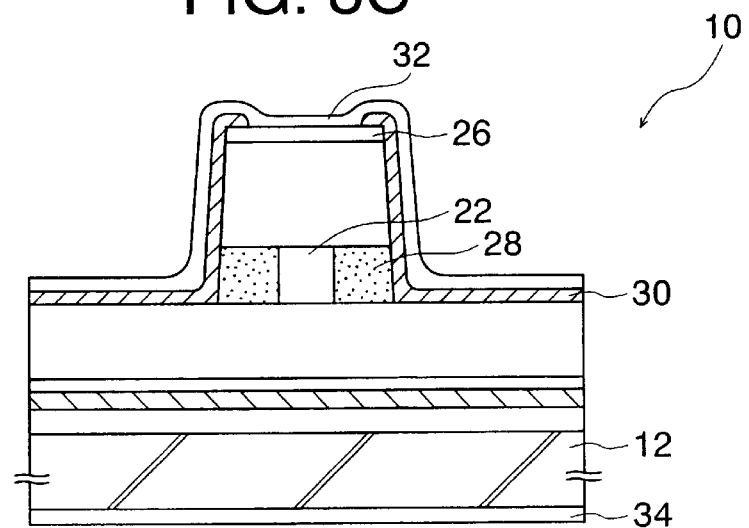

Thereafter, as shown in FIG. 3B, the p-GaInAs contact layer 26, p-InP cladding layer 24, and p-AlInAs layer 22 are selectively etched to configure a 10-$\mu$m-wide ridge stripe, which exposes top of the p-InP layer 20 at both sides of the ridge stripe.

The p-AlInAs layer 22 in the ridge stripe is selectively oxidized by a known process and known conditions by progressively oxidizing the p-AlInAs layer 22 from the side surfaces toward the internal of the ridge stripe, with the central region of the p-AlInAs layer 22 being left un-oxidized. Thus, a 3.5-μm-wide Al-oxidized region 28 is formed at each side of the ridge stripe in the p-AlInAs layer 22.

Subsequently, a SiN film not shown is formed on the layer structure including the ridge stripe, followed by selective removal thereof to form an opening for exposing the p-GaInAs contact layer 26 on the top of the ridge stripe. A p-side electrode 32 including Ti/Pt/Au films are formed on the entire surface including the surface of the p-GaInAs contact layer 26, and an n-side electrode 34 including AuGeNi/Au films is formed on the bottom surface of the n-InP substrate 12, as shown in FIG. 3C. Thus, the optical modulator 10 of FIG. 2 can be achieved.

Second Embodiment

Figure 4:
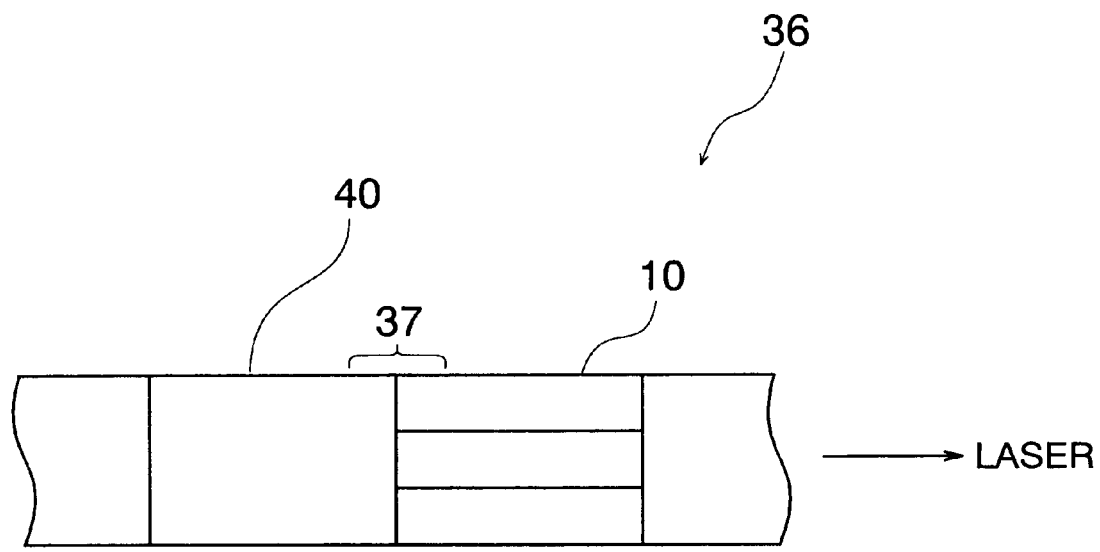
FIG. 4 is top plan view of an integrated optical device according to a second embodiment of the present invention.

Referring to FIG. 4, a semiconductor optical device, generally designated by numeral 36, according to the present embodiment is an example of a second aspect of the present invention.

Figure 5:
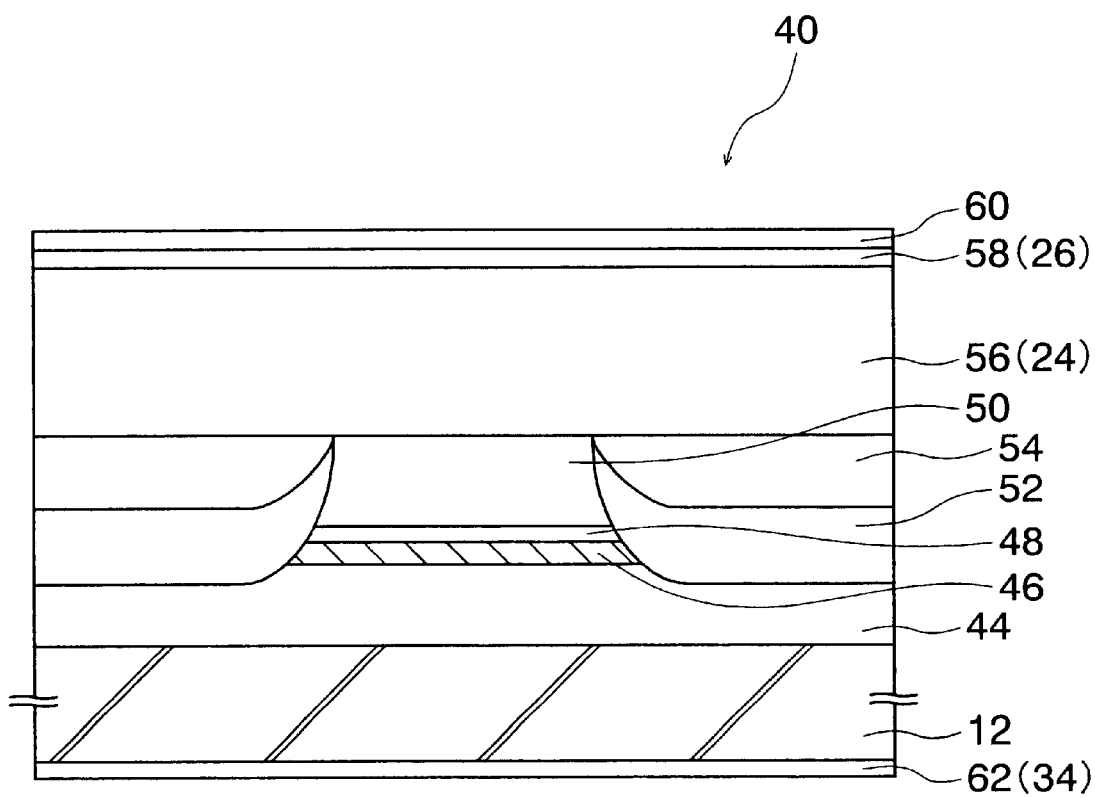
FIG. 5 is a sectional view of a semiconductor laser device formed in the optical device of FIG. 4.

The semiconductor optical device includes a semiconductor laser device 40 and a ridge-type optical modulator 10, which are coupled together is by a coupling area 37. The structure of the semiconductor laser device 40 is shown in FIG. 5, and the structure of the coupling area is shown in FIG. 6.

The semiconductor laser device 40 and the optical modulator 10 are coupled together by an optical waveguide 38 interposed therebetween. The semiconductor optical device has a butt-joint structure, wherein at least one layer of the semiconductor laser device 40 is coupled to a corresponding layer of the optical modulator 10 with a butt-joint structure formed in the optical waveguide 38.

The semiconductor laser device 40 is a distributed feedback laser device (DFB-LD) of a buried heterosructure (BH) including GaInAsP-based materials. As shown in FIG. 5, the semiconductor laser device 40 has a layer structure mounted on an n-InP substrate 12 which also mounts thereon the optical modulator 10. The layer structure includes an n-InP cladding layer 44, a GaInAsP-based MQW 46, a GaInAsP layer 48 in which a diffraction grating is formed, an a p-InP cladding layer 50, which are consecutively formed on the n-InP substrate 12.

Among the layers of the layer structure, a top portion of the n-InP cladding layer 44, MQW 46, GaInAsP layer 48 and the p-InP cladding layer 50 are configured as a ridge stripe. Both the sides of ridge stripe are buried by a combination of p-InP blocking layer 52 and n-InP blocking layer 54, which form a current confinement structure using a p-n junction.

A p-InP cladding layer 56 and a p-GaInAs contact layer 58 are consecutively formed on the p-InP cladding layer 50 and the n-InP blocking layer 54 in the semiconductor laser 40. The p-InP layer 56 and the p-GaInAs contact layer 58 are formed as common layers with the p-InP layer 24 and the p-GaInAs layer 26, respectively, in the optical modulator 10.

A p-side electrode 60 including Ti/Pt/Au films is formed on the p-GaInAs layer 58, and an n-side electrode 62 is formed as a common layer with the n-side electrode 34 of the optical modulator 10 on the bottom surface of the InP substrate 12.

The n-cladding layer 44 is 100 nm thick, and has a carrier density of $5 \times 10^{17}$ cm$^{-3}$: the MQW 46 has a lasing wavelength ($\lambda$ g) of 1.55 μm: the GaInAsP layer 48 is 10 nm thick, has a wavelength of 1.2 μm, and includes therein a diffraction a grating: and the p-InP cladding layer 50 is 200 nm thick and has a carrier density of $5 \times 10^{17}$ cm$^{-3}$.

The p-InP burying layer 52 is 500 nm thick, and has a carrier density of $1 \times 10^{18}$ cm$^{-3}$: the n-InP layer 54 is 500 nm thick, and has a carrier density of $1 \times 10^{18}$ cm$^{-3}$ the p-InP cladding layer 56 is 2000 nm thick, and has a carrier density of $1 \times 10^{18}$ cm–3: and the p-GaInAs contact layer 58 is 300 nm thick, and has a carrier density of $1 \times 10^{19}$ cm$^{-3}$.

In the coupling area 37 for the semiconductor laser device 40 and the optical modulator 10, as shown in FIG. 6, the n-InP cladding layer 14, AlGaInAs-based MQW 16, GaInAsP optical confinement layer 18, p-InP cladding layer 20, p-AlInAs layer 22, and p-InP cladding layer 23 in the optical modulator 10 are coupled with the n-InP cladding layer 44, GaInAsP-based MQW 46, GaInAsP layer 48 including the diffraction grating and the p-InP cladding layer 50, respectively, in the semiconductor laser device 40 with butt-join structures. The p-InP cladding layer 23 functions as a protective layer for the p-AlInAs layer 22.

Fabrication of Second Embodiment

Referring to FIGS. 7A to 7H, there are shown fabrication steps for manufacturing the optical device of the second embodiment.

Figure 7A:
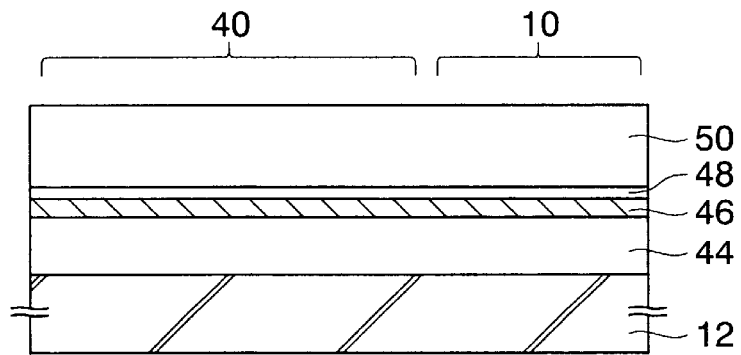
FIGS. 7A to 7H are sectional views of the optical device of FIG. 4 in steps of fabrication thereof.

In FIG. 7A, a layer structure for the GaInAsP-based based DFB-LD 40 is formed over the entire surface of an n-Inp substrate 12 by using known processes. More specifically, a 100-nm-thick n-InP cladding layer 44 having a carrier density of $5 \times 10^{17}$ cm$^{-3}$ a GaInAsP-based MQW 46 having a lasing wavelength of 1.55 μm and a 10-nm-thick GaInAsP waveguide layer 48 are grown on the n-InP substrate 12 by using an epitaxial technique. Then, a diffraction grating is formed in the GaInAsP layer 48 by a known technique, followed by epitaxially growing thereon a 200-nm-thick p-InP cladding layer 50.

Subsequently, a SiN film is formed on the entire surface including the optical modulator area (which is herein designated also by numeral 10) and the DFB-LD area (which is herein designated also by numeral 40), followed by patterning thereof to form a SiN mask which covers the current injection region of the DFB-LD area 40.

By using the SiN mask, the p-InP cladding layer 50, GaInAsP layer 48, MQW 46 and a top portion of the n-InP cladding layer 14 are configured by selective etching to form a ridge stripe. Thereafter, a selective growth process is conducted by using the SiN mask as a selective growth mask to consecutively form a 500-nm-thick p-InP blocking layer 52 having a carrier density of $1 \times 10^{18}$ cm$^{-3}$ and a 500-nm-thick n-InP blocking layer 54 having a carrier density of $1 \times 10^{18}$ cm$^{-3}$, on both the sides of the ridge stripe, to bury the ridge stripe and form a current confinement structure for the DFB-LD 40.

Figure 7B:
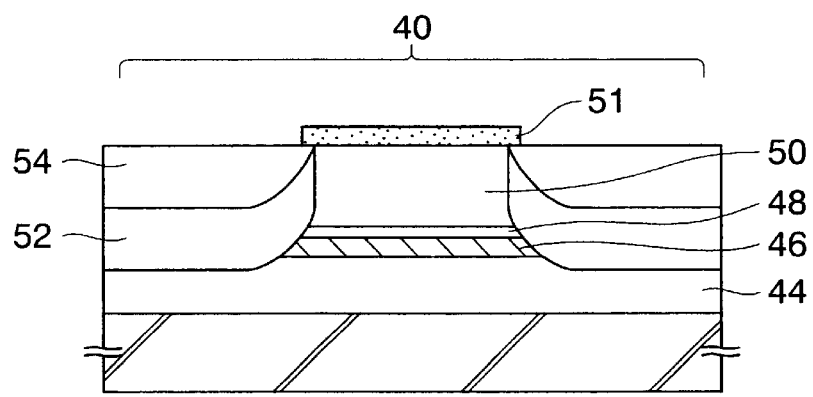
Figure 7C:
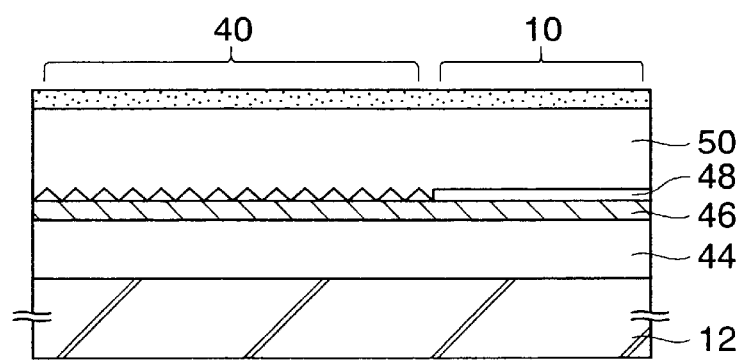

By the above processes, the layer structure shown in FIG. 7B is formed in the DFB-LD area 40, whereas the layer structure shown in FIG. 7C is formed in the optical modulator area 10 and the coupling area, FIG. 7C being taken as viewed along the extending direction of the ridge stripe.

Figure 7D:
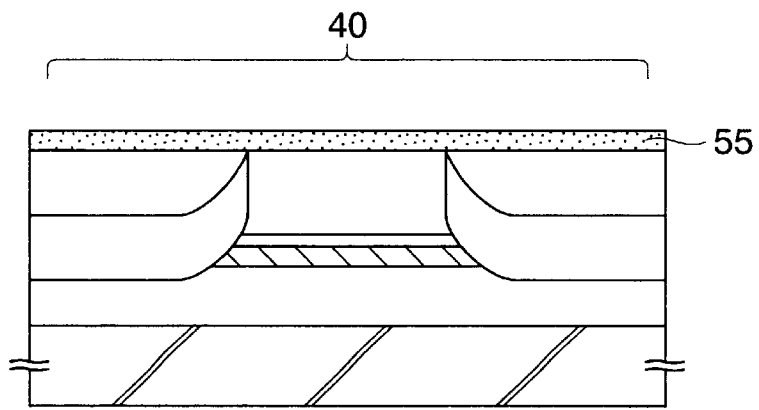

Thereafter, the optical modulator 10 is formed in the optical modulator area. Specifically, the SiN mask 51 is removed and another SiN mask 55 is formed on the DFB-LD area 40, as shown in FIG. 7D. The layer structure formed in the optical modulator area 10 is then subjected to etching to expose the InP substrate 12.

Figure 7E:
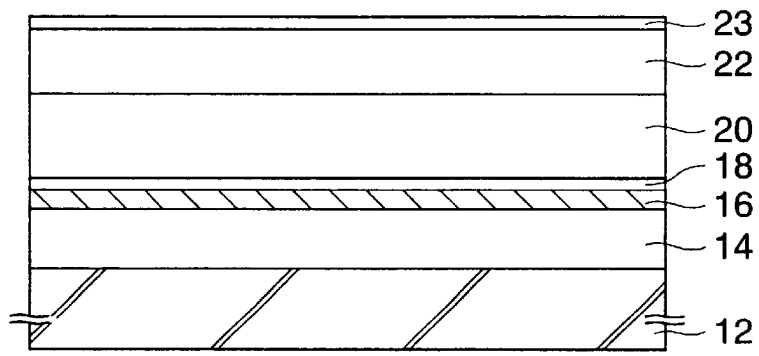

Subsequently, as shown in FIG. 7E, a 100-nm-thick n-InP cladding layer 14 having a carrier density of $5 \times 10^{17}$ cm$^{-3}$, an AlGaInAs-based MQW 16 having a lasting wavelength of 1.52 μm, a 10-nm-thick GaInAsP optical confinement layer 18 having a wavelength of 1.2 μm, a 50-nm-thick p-InP cladding layer 20 having a carrier density of $5 \times 10^{17}$ cm$^{-3}$, a 100-nm-thick p-AlInAs layer 22 having a carrier density of $1 \times 10^{18}$ cm$^{-3}$, and a 10-nm-thick p-InP cladding layer 23 having a carrier density of $1 \times 10^{18}$ cm$^{-3}$ are consecutively grown in the optical modulator area by epitaxial processes. The p-InP cladding layer 23 functions as a protective layer for the p-AlInAs layer 22.

In the step of growing the barrier layers in the MQW 16 and the p-AlInAs layer 22, CBr$_4$ gas is added in the material gas in an amount of 5 to 50 mol. percents.

In the selective growth process of the typical Al-based semiconductor layer, the Al-based semiconductor layer generally has a poor film property due to growth of the polycrystalline substance on the SiN mask. Thus, it is preferable that CBr$_4$ gas be added in the material gas as an etchant to remove the polycrystalline substance grown on the SiN mask by etching, thereby selectively growing the Al-based semiconductor layer having an excellent film property.

In addition, it is preferable that CBr$_4$ be added in the material gas in the step of growing the barrier layers in the MQW for doping the barrier layers with carbon to achieve a modulation-doped structure.

If the etchant as described above does not include carbon as an additive, and includes HCl, for example, the etchant may be preferably used for growing the well layers in the MQW for prevention of the polycrystalline substance.

Figure 7F:
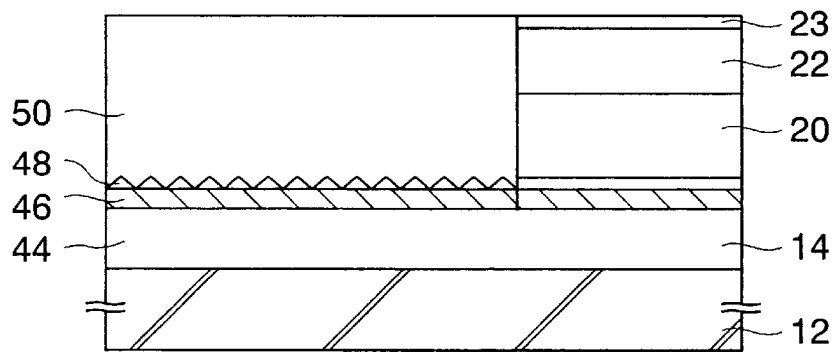

By using the above steps, the layer structure shown in FIG. 7D is maintained in the DFB-LD area 40 whereas the layer structure shown in FIG. 7E is formed in the optical modulator area 10. In addition, the layer structure shown in FIG. 7F is formed in the coupling area, FIG. 7F being taken as viewed along the ridge stripe in the DFB-LD area 40.

Then, the p-InP cladding layer 24 and GaInAs contact layer 26 (58) are formed. Specifically, the SiN mask 55 is removed from the DFB-LD area 40, followed by growth of a 2000-nm-thick p-InP cladding layer 24 (56) having a carrier density of $1 \times 10^{18}$ cm$^{-3}$ and a 300-nm-thick p-GaInAs contact layer 26 (58) having a carrier density of $1 \times 10^{19}$ cm$^{-3}$ by using an epitaxial technique.

Figure 7G:
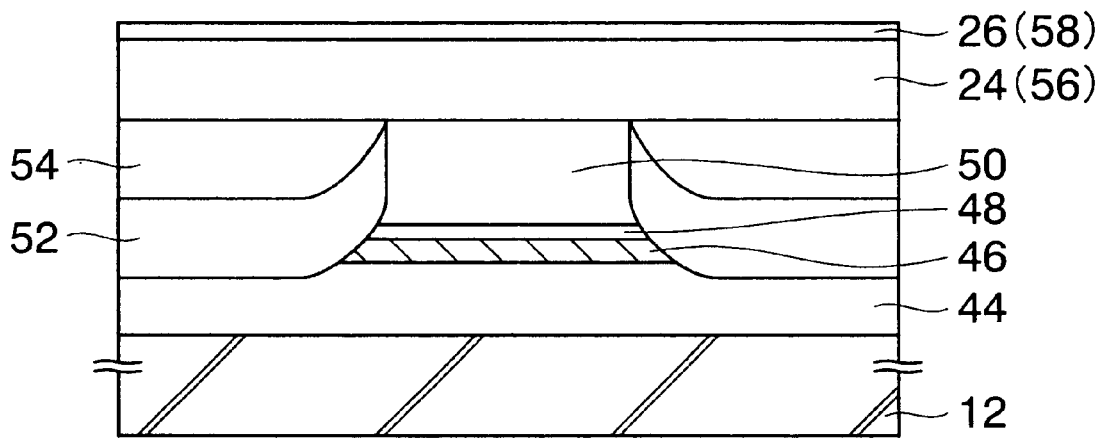
Figure 7H:
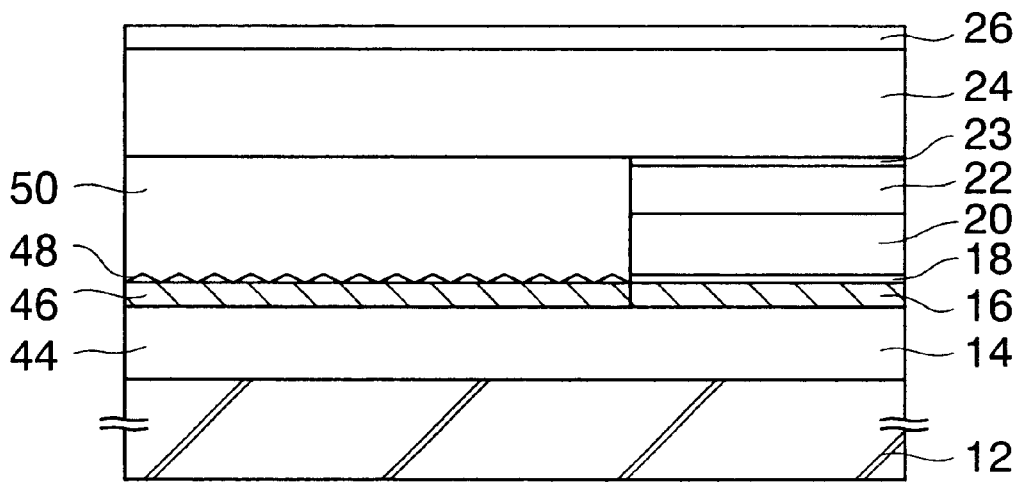

After the above processes, the layer structure shown in FIG. 7G is formed in the DFB-LD area 40, the layer structure shown in FIG. 3A is formed in the optical modulator area 10, and the layer structure shown in FIG. 7H is formed in the coupling area 37.

Thereafter, a current confinement structure is formed in the optical modulator area 10. Specifically, an etching mask (not shown) is formed on the entire surface of the DFB-LD area 40 and the surface of a region to be formed as a current injection region in the optical modulator area 10. An etching step is then conducted to the p-AlInAs layer 22, p-InP cladding layer 24 and p-GaInAs contact layer 26 by using the etching mask to form a ridge stripe, as shown in FIG. 3B, at the location passed by the extension extending from the current injection region of the DFB-LD area 40, to thereby form a 10 μm-wide ridge stripe which exposes the p-InP cladding layer 20 in the optical modulator area 10.

Then, an oxidation process is conducted from both the sides of the ridge stripe of the optical modulator area 10 toward the interior thereof, thereby oxidizing the Al content in the p-AlInAs layer 22, as shown in FIG. 3B. Thus, a pair of 3.5-μm-wide Al-oxidized regions 28 are formed at both the sides of the ridge stripe, with the central region of the AlInAs layer 22 being remained unoxidized.

Thereafter, a SiN film 30 is formed on the p-InP layer 20 and along the ridge stripe of the optical modulator area 10, followed by selective etching thereof to form an opening for exposing a portion of the p-GaInAs layer 26.

Subsequently, p-side and n-side electrodes are formed. Specifically, the p-side electrodes 60 and 32 each including Ti/Pt/Au films are separately formed in the DFB-LD area 40 and the optical modulator area 10, respectively, as shown in FIGS. 5 and 2. The n-side electrode 34 including AuGeNi/Au films is formed on the bottom surface of the InP substrate 12 common to both the areas 40 and 10.

In an alternative of the above process, the AlGaInAs-based optical modulator may be formed first, then the GaInAsP-based DFB-LD may be formed by a re-growth process. In this case, it is liable that the resultant optical device has degraded device characteristics, although the disadvantage in the above embodiment that the polycrystalline substance is deposited on the SiN selective growth masks is removed. The degradation of the device characteristics are considered to result from the fact that there is a significant difference in the quantum well characteristics between the structure formed in the vicinity of the mask edge and that formed in the area which is not affected by the mask due, as a result of the active layer being grown in the DFB-LD. Thus, it is preferable in fabrication of the optical device of the second embodiment that the AlGaInAs-based optical modulator be formed in the second growth step. In this step, addition of etchant such as CBr$_4$ is quite effective.

In the optical device 36 fabricated by the method of the present embodiment, since the DFB-LD 40 is formed by an ordinary fabrication process, the resultant DFB-LD 40 has laser characteristics similar to those in the conventional DFB-LD. On the other hand, the optical modulator 10 has excellent characteristics as described before.

Third Embodiment

Figure 8:
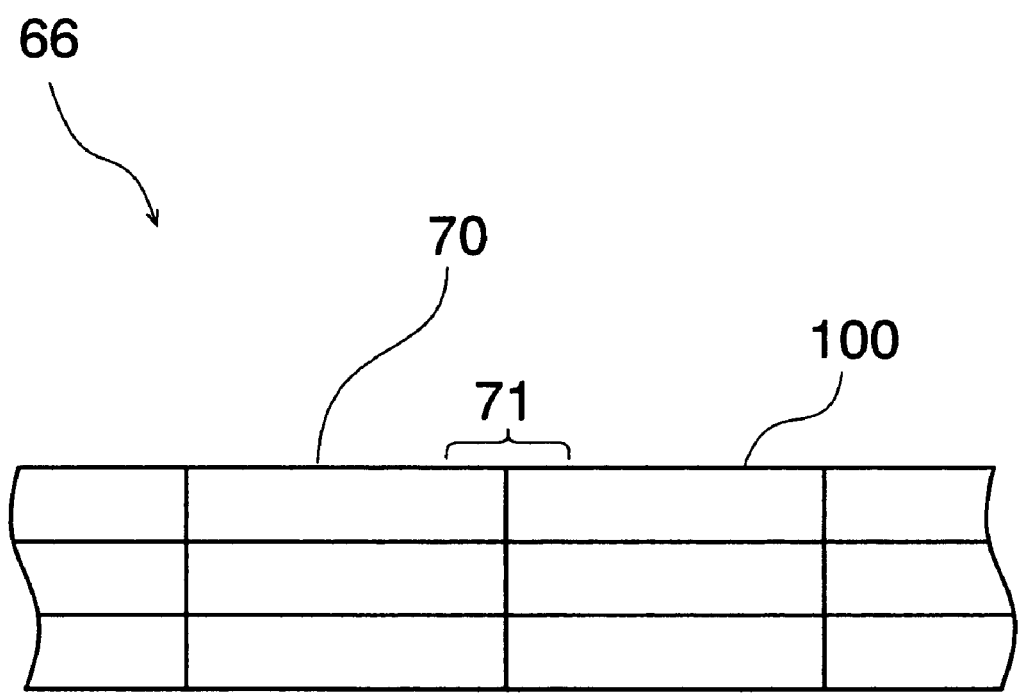
FIG. 8 is a top plan view of an optical device according to a third embodiment of the present invention.
Figure 9:
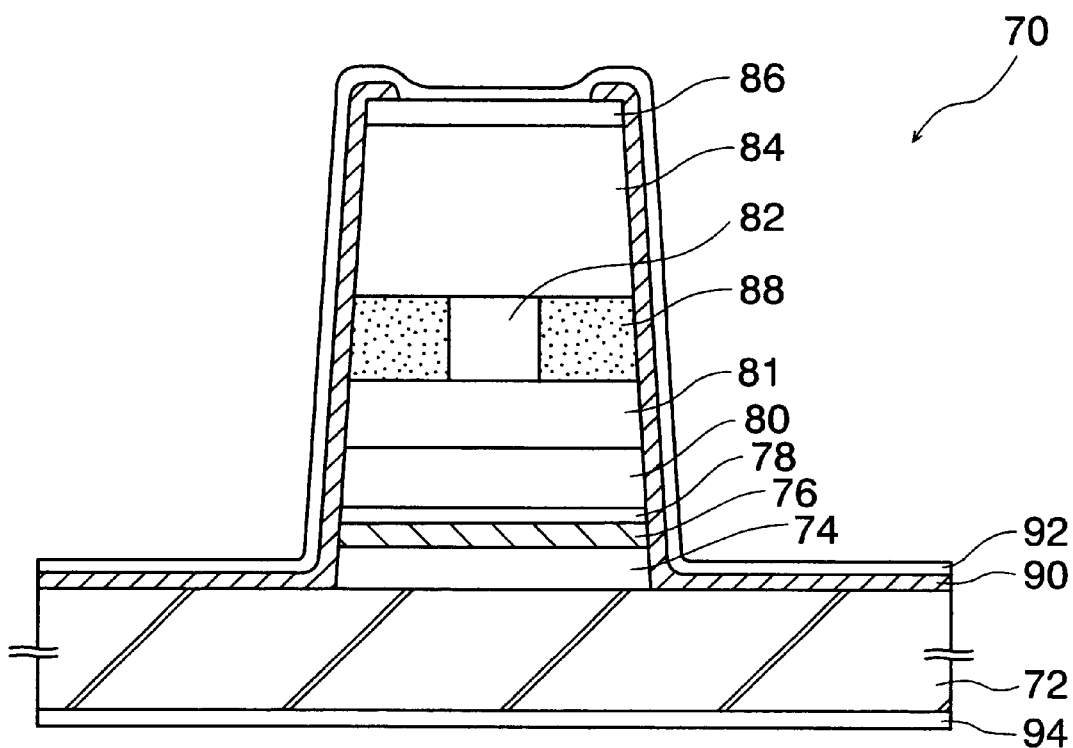
FIG. 9 is a sectional view of the semiconductor laser device disposed in the optical device of FIG. 8.
Figure 10:
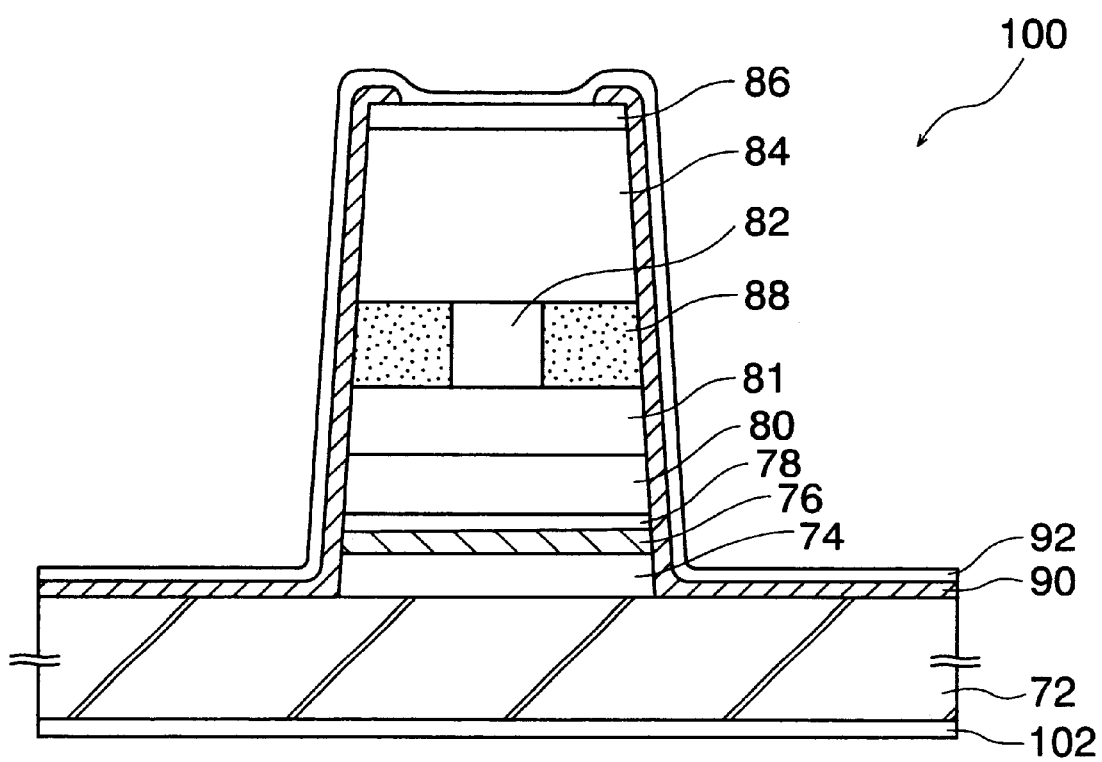
FIG. 10 is a sectional view of the optical modulator disposed in the optical device of FIG. 8.

Referring to FIG. 8, a semiconductor optical device according to the third embodiment includes a semiconductor laser device 70 and an optical modulator 100 which are coupled by a coupling area 71, similarly to the second embodiment. In this embodiment, the layers in the semiconductor laser device 70 and the optical modulator 100 have different film compositions as viewed in the thickness direction as a result of the area-selective growth process. The layer compositions in the semiconductor laser device 70 is similar to those in the optical modulator 100. FIGS. 9 and 10 show the semiconductor laser device 70 and the optical modulator 10, respectively.

The semiconductor laser device 70 is a DFB-LD of ridge waveguide type, and has an AlGaInAs-based layer structure including an n-InP cladding layer 74, an AlGaInAs-based MQW 76, a GaInAsP layer 78 including a diffraction grating, a p-InP cladding layer 80, a p-InP cladding layer 81, a p-AlInAs layer 82, a p-InP cladding layer 84 and a p-GaInAs contact layer 86, which are consecutively grown on an n-InP sub 72.

The n-InP cladding layer 74 has a thickness of 100 nm, and a carrier density of $5 \times 10^{17}$ cm$^{-3}$: the MQW 76 has a lasing wavelength of 1.55 μm: the GaInAsP layer 78 has a thickness of 8 nm and a wavelength of 1.2 μm: the p-InP cladding layers 80 and 81 each has a thickness of 100 nm and a carrier density of $5 \times 10^{17}$ cm$_{-3}$: the p-AlInAs layer 82 has a thickness of 100 nm and a carrier density of $1 \times 10^{18}$ cm$^{-3}$: the p-InP cladding layer 84 has a thickness of 2000 nm and a carrier density of $1 \times 10^{18}$ cm$^{-3}$: and the p-GaInAs contact layer 86 has a thickness of 300 nm and a carrier density of $1 \times 10^{19}$ cm$^{-3}$.

The layer structure formed on the n-InP substrate 72 and including n-InP cladding layer 74, MQW 76, GaInAsP layer 78 including the diffraction grating, p-InP cladding layers 80 and 81, p-AlInAs layer 82, p-InP cladding layer 84 and p-GaInAs contact layer 86 is configured as a 10-μm-wide ridge stripe.

The p-AlInAs layer 82 has a pair of Al-oxidized regions 88 formed by selectively oxidizing the Al content therein and sandwiching therebetween a central un-oxidized region. Each of the Al-oxidized regions 88 has a width of 3.5 μm.

On the layer structure including the ridge stripe, a SiN film 90 is formed having an opening on top of the ridge stripe. A p-side electrode 92 including Ti/Pt/Au films is in contact with the underlying p-GaInAs layer 86 through the opening, and an n-side electrode 94 including AuGeNi/Au films is formed on the bottom surface of the n-InP substrate 72

The optical modulator 100 has an AlGaInAs-based layer structure formed on the common n-InP substrate 72 and including an n-InP cladding layer 74, an AlGaInAs-based MQW 76, a GaInAsP optical confinement layer 78, p-InP cladding layers 80 and 81, a p-AlInAs layer 82, a p-InP cladding layer 84 and a p-GaInAs contact layer 86, each of which extends from a corresponding one of the layers in the layer structure of the semiconductor laser device 70 at the optical coupling area.

In the layer structure, each of the n-InP cladding layer 74, MQW 76, GaInAsP layer 78 and p-InP cladding layer 80 in the optical modulator 100 is formed as a common layer with the corresponding one of the layers in the layer structure in the semiconductor laser device 70, and yet has a smaller thickness compared to the corresponding layer. For example, the n-InP cladding layer 74, GaInAsP layer 78, p-InP cladding layer 80 have thicknesses of 80 nm, 6 nm and 80 nm, respectively, and the GaInAsP layer 78 has no diffraction grating. In addition, the MQW is controlled to have a lasing wavelength of 1.52 μm.

Each of the p-InP cladding layer 81, p-AlInAs layer 82, p-InP cladding layer 84 and p-GaInAs contact layer 86 has a film thickness and a carrier density equal to those of the corresponding layer in the semiconductor laser device 70.

The optical modulator 100 has a layer structure formed on the n-InP substrate 72 and configured as a 10-μm-wide ridge stripe similarly to the semiconductor laser device 70 and extending from the ridge stripe of the semiconductor laser device 70.

The p-AlInAs layer 82 includes a pair of 3.5-μm-wide Al-oxidized regions 88 located at both sides of the ridge stripe and sandwiching therebetween a central un-oxidized region.

On the layer structure including the ridge stripe except for the top thereof, a SiN film 90 is formed as an insulation/ protection film. A p-side electrode including Ti/Pt/Au films is in contact with the underlying p-GaInAs contact layer 86 through the opening of the SiN film 90, and an n-15 side electrode 94 is formed on the bottom surface of the n-InP substrate 72.

Figure 11:
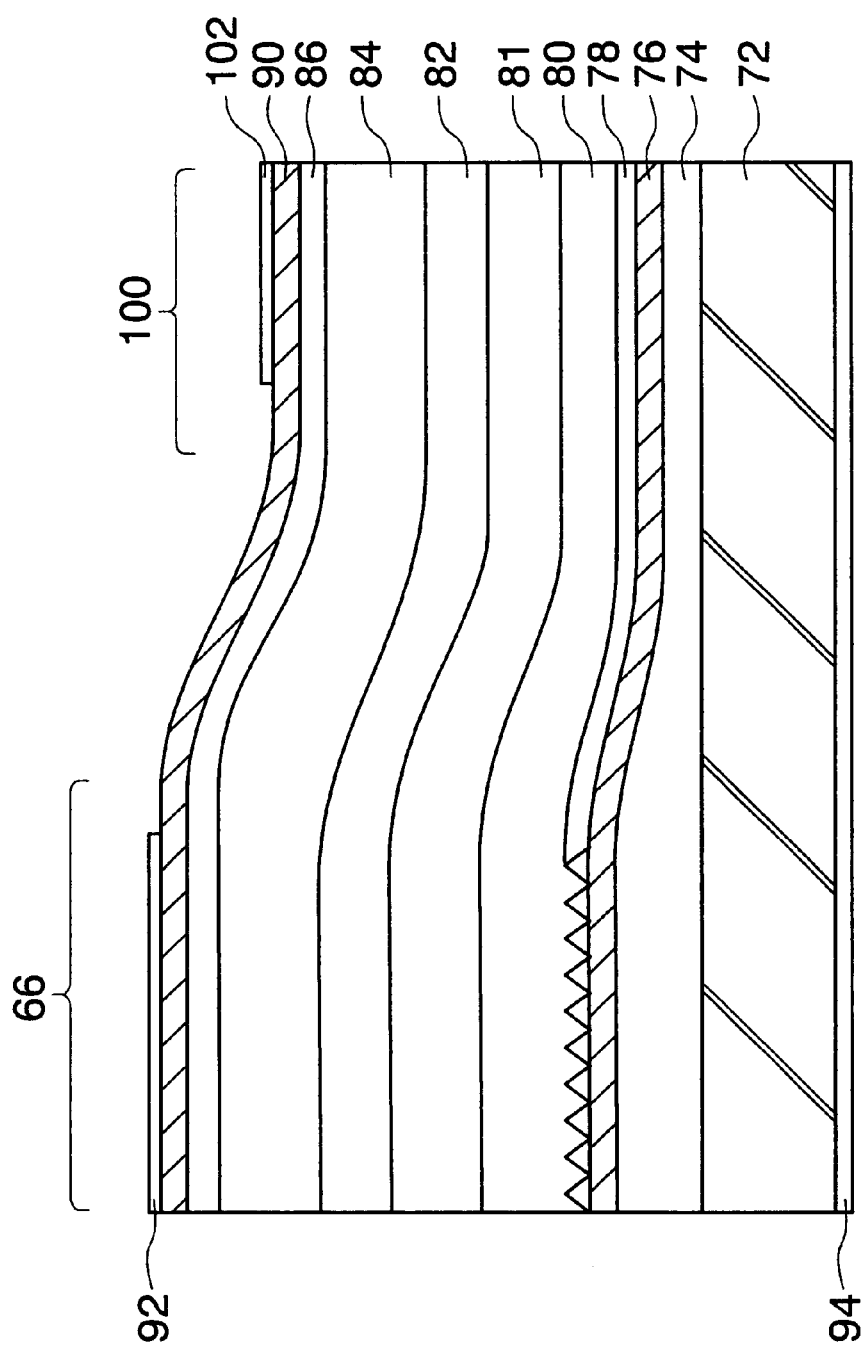
FIG. 11 is a partial sectional view of the optical device of FIG. 8.

In the semiconductor optical device 66 of the present embodiment, as shown in FIG. 11, each of the layers in the optical modulator 100 extends from the corresponding layer in the semiconductor laser device 70, with a difference residing in the film thickness between the corresponding films.

Fabrication of the Third Embodiment

Referring to FIGS. 12A to 12G, fabrication process for the optical device of the present embodiment will be described hereinafter.

Figure 12A:
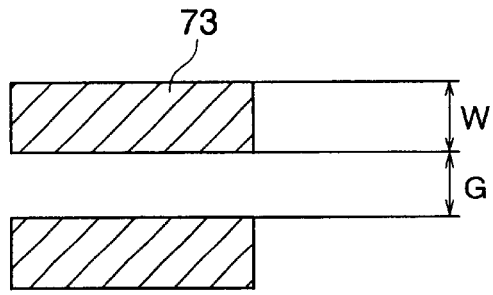
FIGS. 12A to 12G are sectional views of the optical device of FIG. 8 showing the steps of fabrication thereof.
Figure 12B:
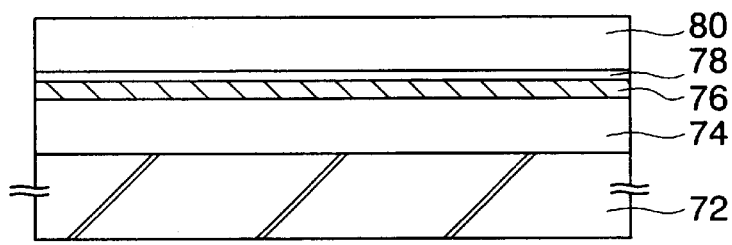

In FIG. 12A, a SiN area-selective growth mask 73 having a specified mask pattern is formed on the semiconductor laser area of the n-InP substrate 72. The mask pattern includes a pair of 30-μm-wide stripes opposing each other with a gap "G" therebetween.

Then, a area-selective epitaxial process is conducted on the InP substrate 72 by using a MOCVD process to form an n-InP cladding layer 74, an AlGaInAs-based MQW 76, a GaInAsP layer 78 having a wavelength of 1.2 μm and a p-InP cladding layer 80 having a carrier density of $5 \times 10^{17}$ cm$^{-3}$.

In the epitaxial process, the layer structure in the optical modulator area 100 which has no mask pattern therein are such that the n-InP cladding layer 74, GaInAsP layer 78 and p-InP cladding layer 80 have film thicknesses of 40 nm, 6 nm and 8 nm, respectively.

In the semiconductor laser area 70, due to the function of the area-selective growth mask pattern 73, the n-InP cladding layer 74, GaInAsP layer 78 and p-InP cladding layer 80 have film thicknesses of 50 nm, 8 nm and 10 nm, respectively.

The MQW 76 has a wavelength of 1.52 μm in the optical modulator area 100 and 1.55 μm in the semiconductor laser area 70. CBr$_4$ gas may be preferably added to the material gas as an etchant during growth of the Al-based compound semiconductor layers, i.e., barrier layers for the MQW 76.

Subsequently, the area-selective growth mask 73 is removed, followed by forming diffraction grating in the GaInAsP layer 78 in the semiconductor laser area 70.

Figure 12C:
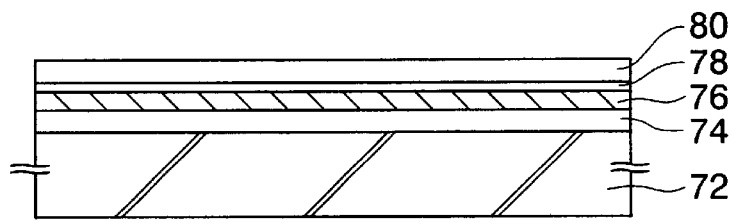
Figure 12D:
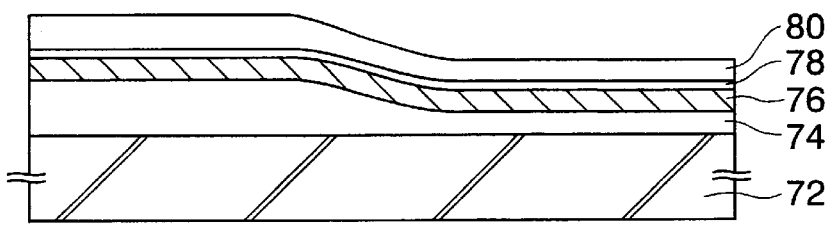

Thus, the layer structure shown in FIG. 12C is formed in the semiconductor laser area 100, whereas the layer structure shown in FIG. 12D is formed in the coupling area.

Figure 12E:
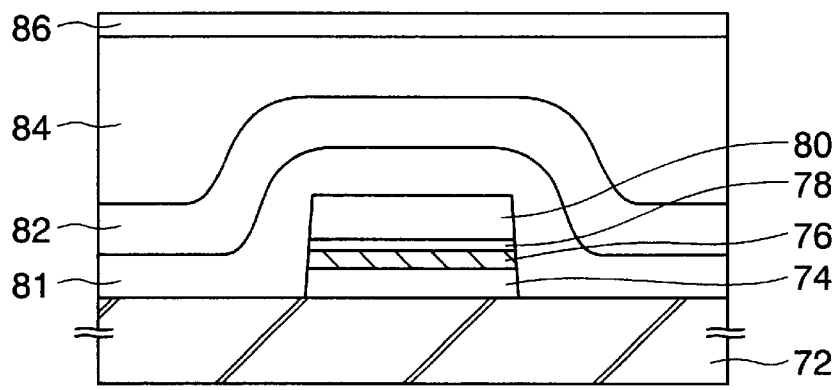
Figure 12F:
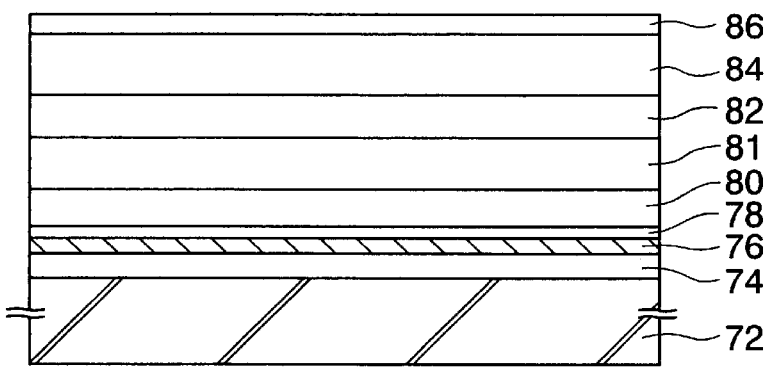
Figure 12G:
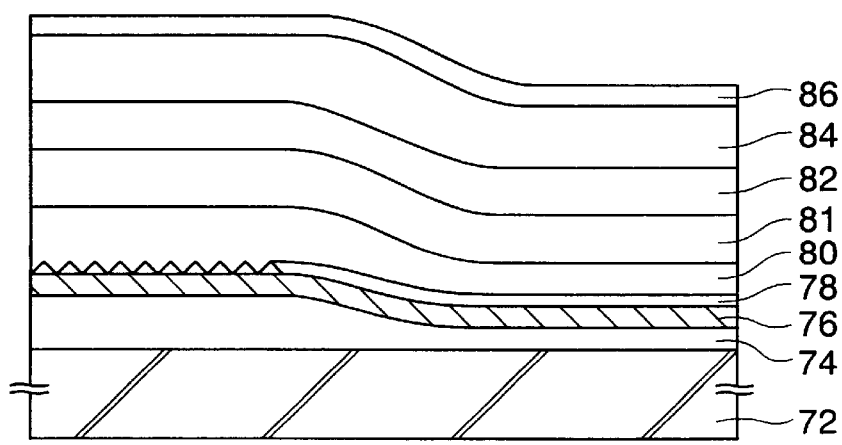

Thereafter, a 100-nm-thick p-InP cladding layer having a carrier density of $5 \times 10^{17}$ cm$^{-3}$, a 100-nm-thick p-AlInAs layer 82 having a carrier density of $1 \times 10^{18}$ cm$^{-3}$, a 2000-nm-thick p-InP cladding layer 84 having a carrier density of $1 \times 10^{18}$ cm$^{-3}$, and a 300-nm-thick p-GaInAs contact layer having a carrier density of $1 \times 10^{19}$ cm$^{-3}$ are grown by epitaxial processes. Thus, the layer structure shown in FIG. 12E is formed in the semiconductor. laser area 70, the layer structure shown in FIG. 12F is formed in the optical modulator area 100. FIG. 12G shows these layer structures in the sectional view taken along the optical axis.

The layer structure formed on the n-InP substrate 72 and including p-GaInAsP contact layer 86, p-InP cladding layer 84, p-AlInAs layer 82, p-InP cladding layer 81, p-InP cladding layer 80, GaInAsP layer 78, MQW 76, and n-InP cladding layer 74 are etched to configure 10-μm-wide ridge stripes in both the semiconductor laser area 70 and the optical modulator area 100, both the ridge stripes being aligned with each other.

Subsequently, an oxidation process is conducted to the ridge stripes in the semiconductor laser area 70 and the optical modulator area 100 to selectively oxidizing the Al content in the p-AlInAs layer 82 from both the sides of the ridge stripes toward the interior thereof, thereby forming a pair of 3.5-μm-wide stripe Al-oxidized regions 88 sandwiching therebetween an un-oxidized region of the oxidized layer 82.

A SiN film 90 is then formed on the semiconductor laser area 70 and the optical modulator area 100, followed by selective etching thereof to form openings therein which expose the underlying p-GaInAsP layer 86 in both the areas 70 and 100.

Finally, p-side electrodes 92 and 102 each including Ti/Pt/Au films are formed in both the areas 70 and 100 except for a portion of the optical waveguide 68, and an n-side electrode including AuGeNi/Au films is formed on the bottom surface of the n-InP substrate 72. Thus, the semiconductor optical device 66 is obtained which includes the semiconductor laser device 70 shown in FIG. 9, the optical modulator 100 shown in FIG. 10, and the optical waveguide 68 shown in FIG. 11 and coupling the semiconductor laser device 70 and the optical modulator 100. The semiconductor optical device 66 as obtained in the present embodiment has excellent device characteristics.

Since the above embodiments are described only for examples, the present invention is not limited to the above embodiments and various modifications or alterations can be easily made therefrom by those skilled in the art without departing from the scope of the present invention.

For example, the AlInAs layer may be disposed on the MQW. The AlInAs layer may also underlie the MQW, if the p-type cladding layer within which the AlInAs layer is disposed underlies the MQW.

What is claimed is:

1. A quantum confinement Stark effect (QCSE) optical modulator comprising a compound semiconductor substrate, and a layer structure formed thereon, said layer structure including an AlGaInAs-based multiple quantum well (MQW), a pair of cladding layers having opposite conductivity types and sandwiching therebetween said MQW, and an Al-containing layer overlying said MQW or formed within one of said cladding layers having a p-type conductivity, said layer structure being configured as a ridge stripe at a portion including said Al-containing layer, said Al-containing layer having a current confinement structure wherein a pair of Al-oxidized regions of said Al-containing layer sandwiches therebetween a central un-oxidized region of said Al-containing layer.

2. The QCSE optical modulator as defined in claim 1, wherein said Al-containing layer is an AlInAs layer.

3. The QCSE optical modulator as defined in claim 1, further comprising a semiconductor laser device formed on said compound semiconductor substrate, said semiconductor laser device having another ridge stripe optically coupled with said ridge stripe.

4. The QCSE optical modulator as defined in claim 3, wherein said semiconductor laser device is a GaInAsP- or AlGaInAs-based laser device.

5. The QCSE optical modulator as defined in claim 3, wherein at least one layer of said another ridge stripe is coupled with a corresponding layer of said ridge stripe by a butt-joint structure.

6. The QCSE optical modulator as defined in claim 3, wherein each layer in said another ridge stripe is formed as a common layer with a corresponding layer in said ridge stripe.

7. The QCSE optical modulator as defined in claim 1, wherein said layer structure has a first width in the region of the multiple quantum well, the first width being along more narrow dimension of the ridge stripe, wherein said central unoxidized region has a second width along the more narrow dimension of the ridge stripe, and wherein the second width is less than the first width.

8. The QCSE optical modulator as defined in claim 1, wherein at least one of the Al-oxidized regions has a thickness which is less than the thickness of the cladding layer having p-type conductivity.

9. The QCSE optical modulator as defined in claim 1, wherein the multiple quantum is located within a layer that lies below the bottom of the ridge stripe.

* * * * *